(12) United States Patent
Lasich (10) Patent No.: US 7,076,965 B2
(45) Date of Patent: Jul. 18, 2006

(54) COOLING CIRCUIT FOR RECEIVER OF SOLAR RADIATION

(76) Inventor: John Beavis Lasich, 11 Pretoria St., Balwyn (AU) VIC 3103

(*) Notice: Subject to any disclaimer, the term of this patent is extended or adjusted under 35 U.S.C. 154(b) by 0 days.

(21) Appl. No.: 10/473,380

(22) PCT Filed: Mar. 28, 2002

(86) PCT No.: PCT/AU02/00402

§ 371 (c)(1),
(2), (4) Date: Sep. 26, 2003

(87) PCT Pub. No.: WO02/080286

PCT Pub. Date: Oct. 10, 2002

(65) Prior Publication Data

US 2004/0103680 A1 Jun. 3, 2004

(30) Foreign Application Priority Data

Mar. 28, 2001 (AU) .................................... PR4038

(51) Int. Cl.
*F25D 23/12* (2006.01)
*H01L 25/00* (2006.01)
*H02N 6/00* (2006.01)

(52) U.S. Cl. ...................... 62/259.2; 136/246; 136/244

(58) Field of Classification Search ............... 62/259.2; 136/246, 244, 248, 251
See application file for complete search history.

(56) References Cited

U.S. PATENT DOCUMENTS

| 4,002,031 | A | * | 1/1977 | Bell ........................ 60/641.15 |
| 4,187,123 | A | | 2/1980 | Diggs |
| 4,361,717 | A | * | 11/1982 | Gilmore et al. ............. 136/246 |
| 4,465,734 | A | | 8/1984 | Laroche et al. |
| 4,491,681 | A | | 1/1985 | Kirpich |
| 4,807,969 | A | | 2/1989 | Shimodaira et al. |
| 4,836,861 | A | * | 6/1989 | Peltzer et al. ............... 136/246 |

FOREIGN PATENT DOCUMENTS

| AU | A 81973/87 | 6/1989 |
| DE | 2945908 | 5/1981 |
| DE | 3612325 A1 | 10/1986 |
| DE | 4116894 A1 | 11/1992 |
| DE | 4326845 A1 | 2/1994 |
| EP | 0464738 B1 | 1/1992 |
| EP | 0789405 A2 | 8/1997 |

(Continued)

OTHER PUBLICATIONS

International Preliminary Examination Report of PCT Application No. PCT/AU02/00401.

(Continued)

*Primary Examiner*—Chen Wen Jiang
(74) *Attorney, Agent, or Firm*—Klarquist Sparkman LLP (57) ABSTRACT

A receiver for a system for generating electrical power from solar radiation is disclosed. The systems includes the receiver and a means (3) for concentrating solar radiation onto the receiver. The receiver includes a plurality of photovoltaic cell modules. Each module includes a plurality of photovoltaic cells (5), and includes an electrical connection that forms part of the receiver electrical circuit. The receiver includes a coolant circuit for cooling the photovoltaic cells with a coolant. The coolant circuit includes a coolant flow path in each module that is in thermal contact with the photovoltaic cells so that in use coolant flowing through the flow path extracts heat from the photovoltaic cells and thereby cools the cells.

39 Claims, 5 Drawing Sheets

FOREIGN PATENT DOCUMENTS

| | | |
|---|---|---|
| EP | 1126529 A2 | 8/2001 |
| FR | 2566183 | 12/1985 |
| JP | 10062017 A | 3/1988 |
| JP | 10062017 A * | 3/1998 |
| WO | WO 95/02199 | 1/1995 |
| WO | WO 97/49956 | 12/1997 |
| WO | WO 99/57493 | 11/1999 |
| WO | WO 00/66947 | 11/2000 |
| WO | WO 02/078933 A1 | 10/2002 |
| WO | WO 02/080286 A1 | 10/2002 |

OTHER PUBLICATIONS

International Preliminary Examination Report of PCT Application No. PCT/AU02/00402.

International Preliminary Examination Report of PCT Application No. PCT/AU02/00404.

* cited by examiner

COOLING CIRCUIT FOR RECEIVER OF SOLAR RADIATION

CROSS-REFERENCE TO RELATED APPLICATIONS

This is the National Stage of International Application No. PCT/AU02/00402, filed Mar. 28, 2002, and claims the benefit of Australian Patent Application No. PR4038, filed Mar. 28, 2001.

FIELD

The present invention relates to a receiver of a system for generating electrical power from solar radiation.

BACKGROUND AND SUMMARY

Solar radiation-based electrical power generating systems typically include:

(a) a receiver that includes a plurality of photovoltaic cells that convert solar energy into electrical energy and an electrical circuit for transferring the electrical energy output of the photovoltaic cells; and (b) a means for concentrating solar radiation onto the photovoltaic cells of the receiver.

By way of example, the means for concentrating solar radiation may be a dish reflector that includes a parabolic array of mirrors that reflect solar radiation that is incident on a relatively large surface area of the mirrors towards a relatively small surface area of the photovoltaic cells.

In addition to the parabolic array of mirrors, the above-described dish reflector may also include a matched secondary solar radiation modification mirror system (such as a solar flux modifier).

Another, although not the only other, means for concentrating solar radiation is an array of spaced apart mirrors that are positioned to reflect solar radiation that is incident on a relatively large surface area of the mirrors towards a relatively small surface area of the photovoltaic cells.

The present invention relates more particularly, although by no means exclusively, to a large scale solar radiation-based electrical power generating system of the type described above that is capable of producing substantial amounts of electrical power ready for conditioning to at least 20 kW of standard 3 phase 415 volt AC power.

Applications for such large scale power generating systems include remote area power supply for isolated grids, grid-connected power, water pumping, telecommunications, crude oil pumping, water purification, and hydrogen generation.

One significant issue associated with development of commercially viable solar radiation-based electrical power generating systems of the type described above is long term performance of materials and structural integrity of components of the system made from materials as a consequence of:

(a) exposure to extremely high intensity solar radiation capable of producing high temperatures, i.e. temperatures considerably above 1000° C.;

(b) cycling between high and low intensities of solar radiation; and (c) temperature variations between different parts of structural components.

The receiver is one area of particular importance in this regard.

Specifically, in large scale solar radiation-based electrical power generating systems of the type described above the photovoltaic cells are exposed to solar radiation intensities of at least 200 times the intensity of the Sun during optimum operating conditions. In addition, the photovoltaic cells are subjected to significant cycling between extremely high and low levels of solar radiation and to variations in solar radiation intensity across the surface of the receiver.

An object of the present invention is to provide a receiver that is capable of long term exposure to extremely high intensities of solar radiation, cycling between extremely high and low intensities of solar radiation, and temperature variations between different sections of components of the receiver.

According to the present invention there is provided a system for generating electrical power from solar radiation which includes:

(a) a receiver that includes a plurality of photovoltaic cells for converting solar energy into electrical energy and an electrical circuit for transferring the electrical energy output of the photovoltaic cells; and (b) a means for concentrating solar radiation onto the receiver; and the system being characterised in that the receiver includes a plurality of photovoltaic cell modules, each module includes a plurality of photovoltaic cells, each module includes an electrical connection that forms part of the receiver electrical circuit, the receiver includes a coolant circuit for cooling the photovoltaic cells with a coolant, and the coolant circuit includes a coolant flow path in each module that is in thermal contact with the photovoltaic cells so that in use coolant flowing through the flow path cools the cells.

The applicant has found that the above-described receiver is capable of extracting significant amounts of heat generated by incident solar radiation in an efficient and reliable manner. Specifically, the applicant has found that the preferred embodiment of the receiver described in more detail below is capable of extracting up to 50 W/cm$^2$ of exposed photovoltaic cell. Thus, the receiver addresses the significant issue that a large portion of incident radiation on receivers of large scale solar radiation-based electrical power generating systems is not converted to electricity and manifests itself as heat that reduces the efficiency of photovoltaic cells.

In addition, the modularity of the receiver addresses (at least in part) the issue that optimum locations for large scale solar radiation-based electrical power generating systems tend to be in regions that are remote from major population and manufacturing centres and, therefore, construction of the systems in such remote locations presents significant difficulties in terms of transportation of equipment to the sites, on-site construction, and on-going maintenance (including quick replacement of component parts) at the sites.

In addition, the modularity of the receiver makes it possible to enhance manufacture of the receiver because manufacture can be based on repeat manufacture of a relatively large number of relatively small modules rather than a small number of large components.

Preferably in use the coolant maintains the photovoltaic cells at a temperature of no more than 80° C.

More preferably in use the coolant maintains the photovoltaic cells at a temperature of no more than 70° C.

It is preferred particularly that in use the coolant maintains the photovoltaic cells at a temperature of no more than 60° C.

It is preferred more particularly that in use the coolant maintains the photovoltaic cells at a temperature of no more than 40° C.

Preferably each module includes a structure that supports the photovoltaic cells.

Preferably the support structure defines the coolant flow path for extracting heat from the photovoltaic cells.

Preferably the support structure includes:

(a) a coolant member that at least partially defines the flow path, the coolant member being formed from a material that has a high thermal conductivity; and (b) a substrate interposed between the coolant member and the photovoltaic cells, the substrate including a layer formed from a material that has a high thermal conductivity and is an electrical insulator.

Preferably the coolant member acts as a heat sink.

The coolant member may be formed from any suitable high thermal conductivity material.

By way of example, the coolant member may be a high thermal conductivity metal or ceramic.

Preferably the coolant member is formed from copper.

Preferably the high thermal conductivity/electrical insulator layer of the substrate is formed from a ceramic material.

Preferably the substrate includes a metallised layer interposed between the photovoltaic cells and the high thermal conductivity/electrical insulator layer.

Preferably the substrate includes a metallised layer interposed between the high thermal conductivity/electrical insulator layer and the coolant member.

Preferably the coolant member includes a base, a wall that extends upwardly from the base and contacts the substrate whereby the base, the side wall and the substrate define an enclosed coolant chamber that forms part of the coolant flow path.

Preferably the coolant member includes a series of spaced-apart lands that extend from the base and contact the substrate in a central part of the chamber and define therebetween channels for coolant flow from near one end of the chamber to near an opposite end of the chamber.

Preferably the spaced apart lands are parallel so that the channels are parallel.

With the above-described arrangement there is direct thermal contact between the substrate and coolant flowing through the coolant chamber (including the channels) and between the substrate and the side wall and the lands. This construction provides an effective means for transferring heat from the photovoltaic cells via the substrate to the coolant. In particular, the side wall and the lands provide an effective means of increasing the available contact surface area with the coolant to improve heat transfer to the coolant. This is an important feature given the high levels of heat transfer that are required to maintain the photovoltaic cells at temperatures below 80° C., preferably below 60° C., more preferably below 40° C. A further advantage of the construction is that the side wall and the lands enable lateral movement of the substrate and the coolant member—as is required in many situations to accommodate different thermal expansion of the materials that are used in the construction of the modules. Accommodating different thermal expansion of such materials is an important issue in terms of maintaining long term structural integrity of the modules. In this context, it is important to bear in mind that the high levels of heat transfer that are required to maintain the photovoltaic cells at temperatures below 80° C. place considerable constraints on the materials selection for the components of the modules. As a consequence, preferred materials for different components of the modules and for bonding together different components of the modules are materials that have different thermal expansion. There are two aspects to the issue of materials selection and heat transfer. One aspect is the materials requirements of components of the modules, such as the substrate and the coolant member, to define heat flow paths from the photovoltaic cells to coolant flowing through the coolant chamber. The other aspect is the materials requirements for containing the high hydraulic pressures within the coolant chamber that are required to maintain coolant flow through the coolant chamber at required levels. In particular, the second aspect is concerned with materials selection to achieve sufficient bond strength between the substrate and the coolant member.

Preferably the base includes a coolant inlet and a coolant outlet for supplying coolant to and removing coolant from opposite ends of the chamber, the opposite ends of the chamber forming coolant manifolds.

The above-described coolant inlet, coolant manifolds, coolant outlet, and coolant channels define the coolant flow path of the support structure of the module.

Preferably the ratio of the total width of the channels and the total width of the lands is in the range of 0.5:1 to 1.5:1.

Preferably the ratio of the total width of the channels and the total width of the lands is of the order of 1:1.

Preferably the ratio of the height and the width of each channel is in the range of 1.5:1 to 5:1.

More preferably the ratio of the height and the width of each channel is in the range of 1.5:1 to 2.5:1.

It is preferred particularly the ratio of the height and the width of each channel be of the order of 3:1.

Preferably the receiver includes a frame that supports the modules in an array of the modules.

Preferably the support frame supports the modules so that the photovoltaic cells form an at least substantially continuous surface that is exposed to reflected concentrated solar radiation.

The surface may be flat, curved or stepped in a Fresnel manner.

Preferably the support frame includes a coolant flow path that supplies coolant to the coolant inlets of the modules and removes coolant from the coolant outlets of the modules.

Preferably the coolant is water.

Preferably the water inlet temperature is in the range of 20–30° C.

Preferably the water outlet temperature is in the range of 25–40° C.

Preferably the means for concentrating solar radiation onto the receiver is a dish reflector that includes an array of mirrors for reflecting solar radiation that is incident on the mirrors towards the photovoltaic cells.

Preferably the surface area of the mirrors of the dish reflector that is exposed to solar radiation is substantially greater than the surface area of the photovoltaic cells that is exposed to reflected solar radiation.

According to the present invention there is also provided a photovoltaic cell module for a receiver of a system for generating electrical power from solar radiation, which module includes: a plurality of photovoltaic cells, an electrical connection for transferring the electrical energy output of the photovoltaic cells, and a coolant flow path that is in thermal contact with the photovoltaic cells so that in use coolant flowing through the flow path cools the photovoltaic cells.

Preferred features of the module are as described above.

BRIEF DESCRIPTION OF THE DRAWINGS

The present invention is described further by way of example with reference to the accompanying drawings, of which.

DETAILED DESCRIPTION

Figure 1:
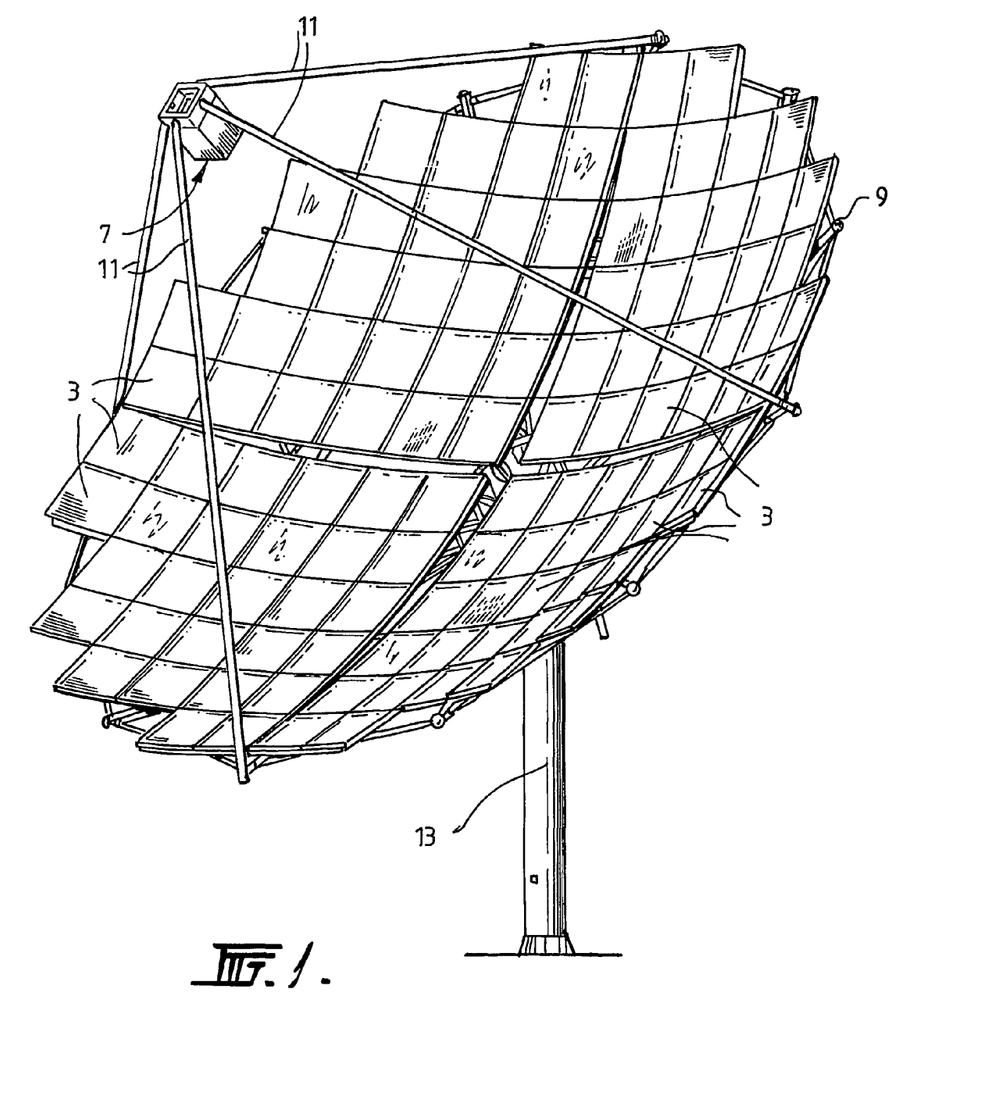
FIG. 1 is a perspective view of a preferred embodiment of a system for generating electrical power from solar radiation.

The solar radiation-based electric power generating system shown in FIG. 1 includes a parabolic array of mirrors 3 that reflects solar radiation that is incident on the mirrors towards a plurality of photovoltaic cells 5.

The cells 5 form part of a solar radiation receiver that is generally identified by the numeral 7.

As is described in more detail hereinafter, the receiver 7 includes an integrated coolant circuit. The surface area of the mirrors 3 that is exposed to solar radiation is substantially greater than the surface area of the photovoltaic cells 5 that is exposed to reflected solar radiation. The photovoltaic cells 5 convert reflected solar radiation into DC electrical energy. The receiver 7 includes an electrical circuit (not shown) for the electrical energy output of the photovoltaic cells.

The mirrors 3 are mounted to a framework 9. The mirrors and the framework define a dish reflector.

A series of arms 11 extend from the framework 9 to the receiver 7 and locate the receiver as shown in FIG. 1.

The system further includes:
(a) a support assembly 13 that supports the dish reflector and the receiver in relation to a ground surface and for movement to track the Sun; and
(b) a tracking system (not shown) that moves the dish reflector and the receiver as required to track the Sun.

As is noted above, the receiver 7 includes a coolant circuit. The coolant circuit cools the photovoltaic cells 5 of the receiver 7 with a coolant, preferably water, in order to minimise the operating temperature and to maximise the performance (including operating life) of the photovoltaic cells 5.

The receiver 7 is purpose-built to include the coolant circuit.

Figure 3:
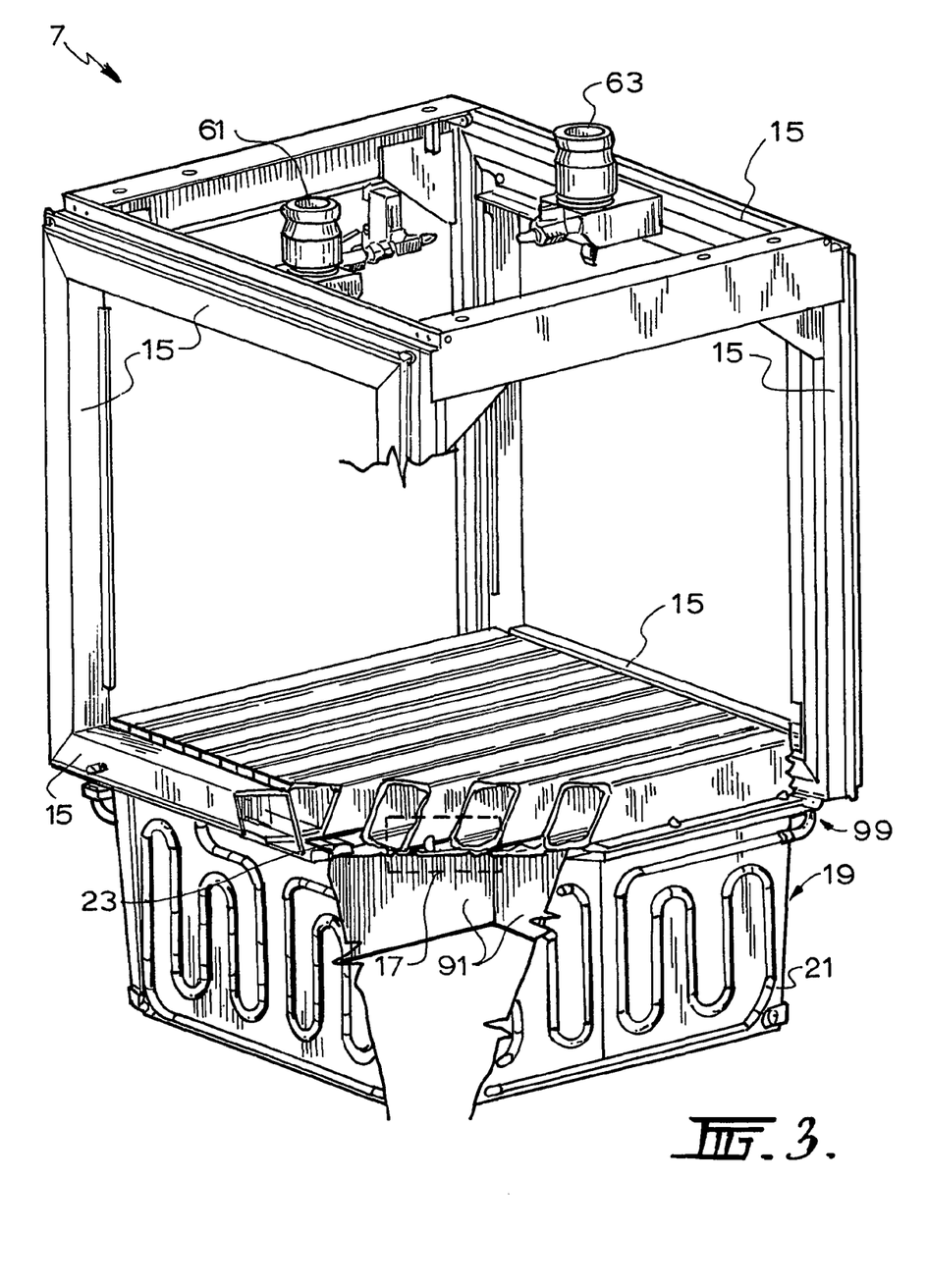
FIG. 3 is a partially cut-away perspective view of the receiver with components removed to illustrate more clearly the coolant circuit that forms part of the receiver.
Figure 4:
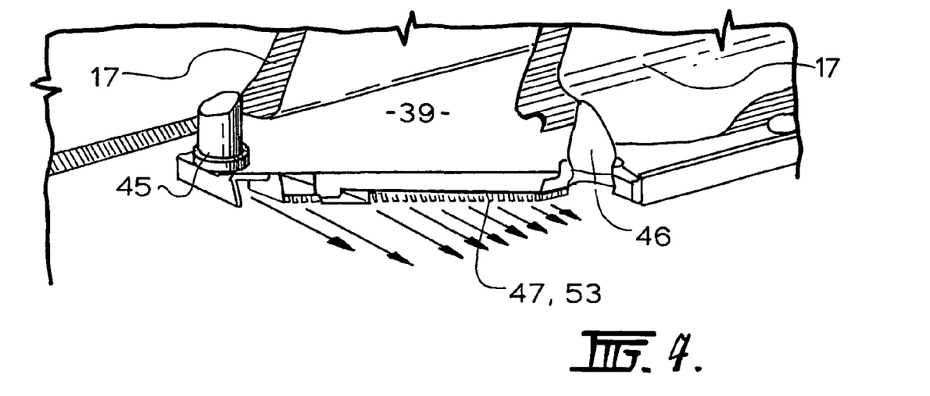
FIG. 4 is an enlarged view of the section of FIG. 3 that is described by a rectangle.

FIGS. 3 and 4 illustrate components of the receiver that are relevant to the coolant circuit. It is noted that a number of other components of the receiver 7, such as components that make up the electrical circuit of the receiver 7, are not included in the Figures for clarity.

With reference to FIGS. 3 and 4, the receiver 7 includes a generally box-like structure that is defined by an assembly of hollow posts 15.

The receiver 7 also includes a solar flux modifier, generally identified by the numeral 19, which extends from a lower wall 99 (as viewed in FIG. 3) of the box-like structure. The solar flux modifier 19 includes four panels 21 that extend from the lower wall 99 and converge toward each other. The solar flux modifier 19 also includes mirrors 91 mounted to the inwardly facing sides of the panels 21.

The receiver 7 also includes an array of 1536 closely packed rectangular photovoltaic cells 5 which are mounted to 64 square modules 23. The array of cells 5 can best be seen in FIG. 2. The term "closely packed" means that the exposed surface area of the photovoltaic cells 5 makes up at least 98% of the total exposed surface area of the array. Each module includes 24 photovoltaic cells 5. The photovoltaic cells 5 are mounted on each module 23 so that the exposed surface of the cell array is a continuous surface.

Figure 2:
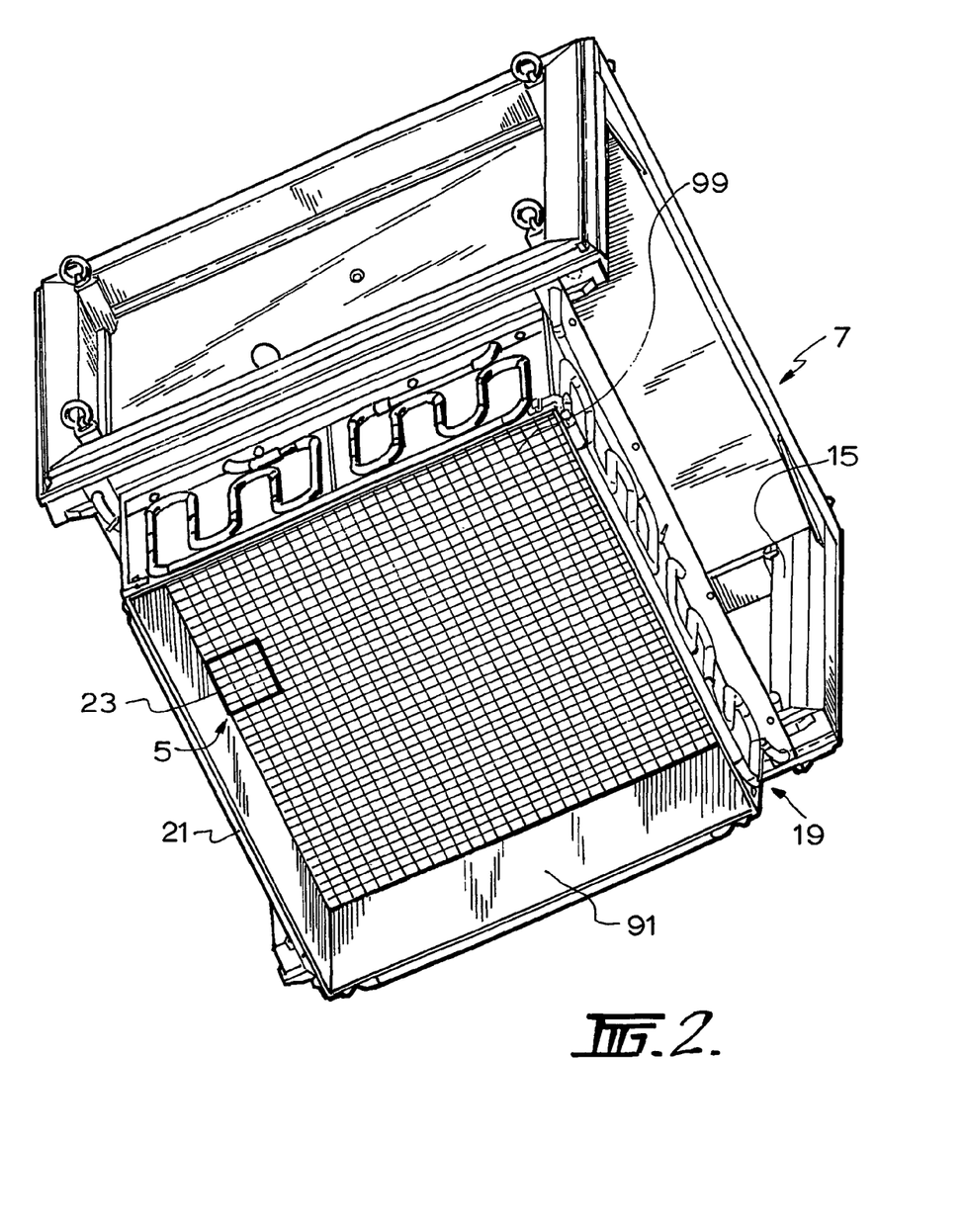
FIG. 2 is a front view of the receiver of the system shown in FIG. 1 which illustrates the exposed surface area of the photovoltaic cells of the receiver.

The modules 23 are mounted to the lower wall 99 of the box-like structure of the receiver 7 so that the exposed surface of the combined array of photovoltaic cells 5 is a continuous plane.

The modules 23 are mounted to the lower wall 99 so that lateral movement between the modules 23 and the reminder of the receiver 7 is possible. The permitted lateral movement assists in accommodating different thermal expansion of components of the receiver 7.

As is described in more detail hereinafter, each module 23 includes a coolant flow path. The coolant flow path is an integrated part of each module 23. The coolant flow path allows coolant to be in thermal contact with the photovoltaic cells 5 and extract heat from the cells 5 so that the cells 5 are maintained at a temperature of no more than 80° C., preferably no more than 60° C., more preferably no more than 40° C.

The coolant flow path of the modules 23 forms part of the coolant circuit.

The coolant circuit also includes the above-described hollow posts 15.

In addition, the coolant circuit includes a series of parallel coolant channels 17 that form part of the lower wall 99 of the box-like structure. The ends of the channels 17 are connected to the opposed pair of lower horizontal posts 15 respectively shown in FIG. 3. The lower posts 15 define an upstream header that distributes coolant to the channels 17 and a downstream header that collects coolant from the channels 17. The modules 23 are mounted to the lower surface of the channels 17 and are in fluid communication with the channels so that coolant flows via the channels 17 into and through the coolant flow paths of the modules 23 and back into the channels 17 and thereby cools the photovoltaic cells 5.

The coolant circuit also includes a coolant inlet 61 and a coolant outlet 63. The inlet 61 and the outlet 63 are located in an upper wall of the box-like structure. The inlet 61 is connected to the adjacent upper horizontal post 15 and the outlet 63 is connected to the adjacent upper horizontal post 15 as shown in FIG. 3.

In use, coolant that is supplied from a source (not shown) flows via the inlet 61 into the upper horizontal post 15 connected to the inlet 61 and then down the vertical posts 15 connected to the upper horizontal post 15. The coolant then flows into the upstream lower header 15 and, as is described above, along the channels 17 and the coolant flow paths of the modules 23 and into the downstream lower header 15. The coolant then flows upwardly through the vertical posts 15 that are connected to the downstream lower header 15 and into the upper horizontal post 15. The coolant is then discharged from the receiver 7 via the outlet 63. The above-described coolant flow is illustrated by the arrows in FIGS. 3 and 4.

FIGS. 5 to 9 illustrate the basic construction of each module 23.

Figure 5:
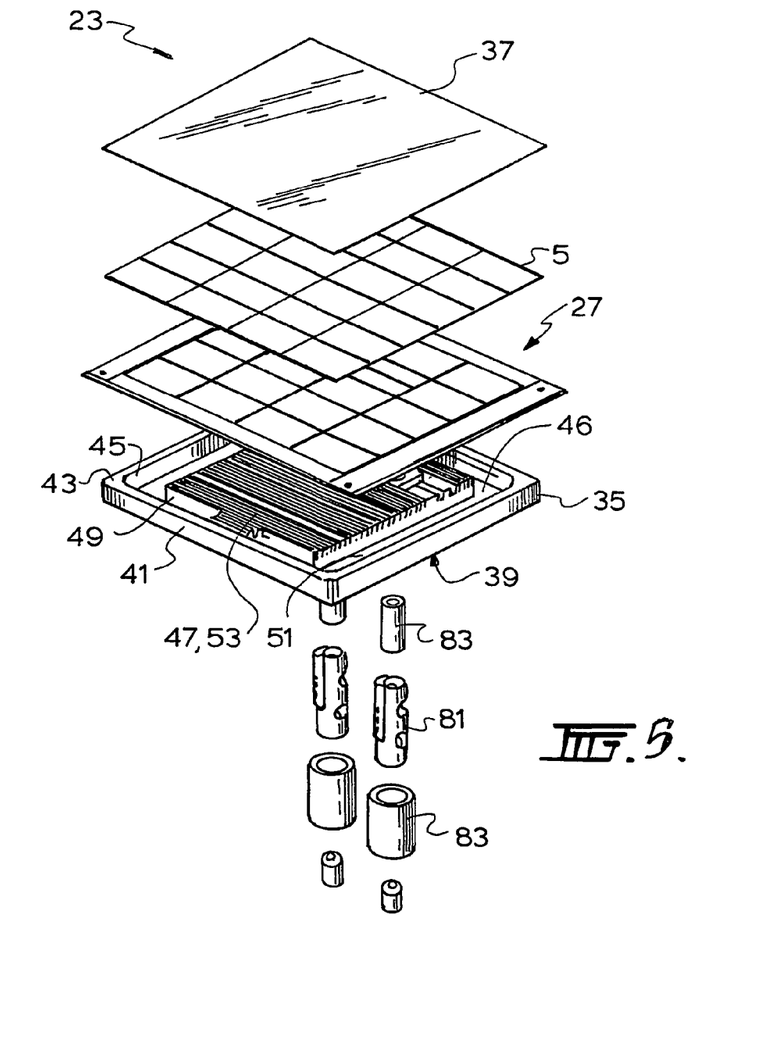
FIG. 5 is an exploded perspective view of a photovoltaic cell module that forms part of the receiver.
Figure 6:
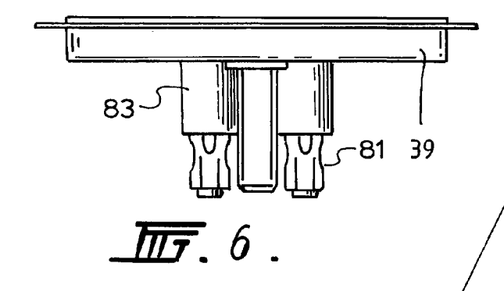
FIG. 6 is a side elevation of the assembled photovoltaic cell module of FIG. 5.
Figure 7:
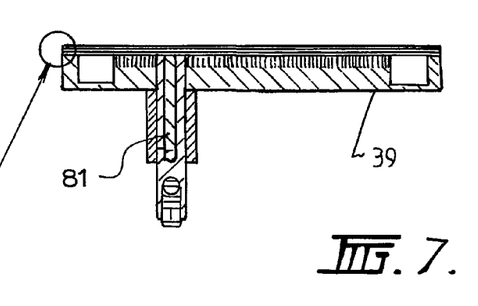
FIG. 7 is a section along the line A—A of FIG. 6.
Figure 8:
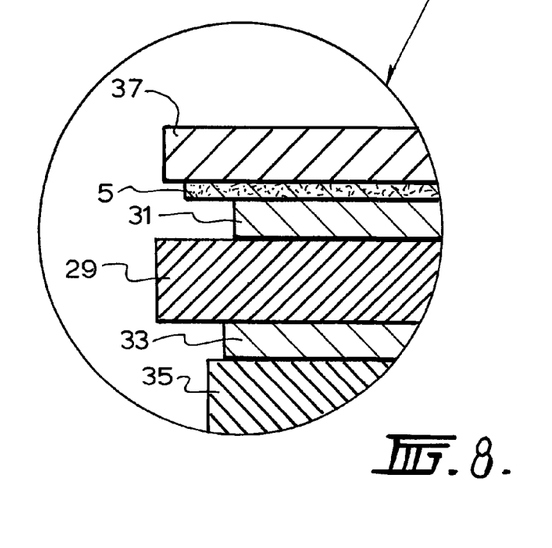
FIG. 8 is an enlarged view of the circled region B in FIG. 7.
Figure 9:
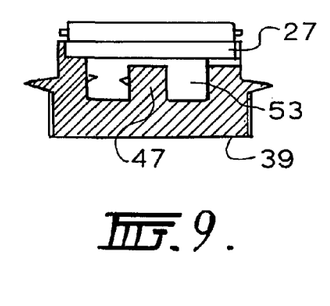
FIG. 9 is an enlarged view of the circled region C in FIG. 7.

As is indicated above, each module 23 includes an array of 24 closely packed photovoltaic cells 5.

Each module 23 includes a substrate, generally identified by the numeral 27, on which the cells 5 are mounted. The substrate includes a central layer 29 of a ceramic material and outer metallised layers 31, 33 on opposite faces of the ceramic material layer 29.

Each module 23 also includes a glass cover 37 that is mounted on the exposed surface of the array of photovoltaic cells 5. The glass cover 37 may be formed to optimise transmission of useful wavelengths of solar radiation and minimise transmission of un-wanted wavelengths of solar radiation.

Each module 23 also includes a coolant member 35 that is mounted to the surface of the substrate 27 that is opposite to the array of photovoltaic cells 5.

The size of the coolant member 35 and the material from which it is made are selected so that the coolant member 35 acts as a heat sink. A preferred material is copper.

Furthermore, the coolant member 35 is formed to define a series of flowpaths for coolant for cooling the photovoltaic cells 5.

Each module 23 also includes electrical connections generally identified by the numeral 81 that form part of the electrical circuit of the receiver 7 and electrically connect the photovoltaic cells 5 into the electrical circuit. The electrical connections 81 are positioned to extend from the outer metallised layer 31 and through the substrate 27 and the coolant member 35. The electrical connections 81 are housed within sleeves 83 that electrically isolate the electrical connections.

The coolant member 35 includes a base 39 and a side wall 41 that extends from the base 39. The upper edge 43 of the side wall 41 is physically bonded to the substrate 27. It can be appreciated from FIG. 5 that the base 35 and the substrate 27 define an enclosed chamber. The base 39 includes a coolant inlet 45 (FIG. 4) and a coolant outlet 46 (FIG. 4). The coolant inlet 45 and the coolant outlet 46 are located in diagonally opposed corner regions of the base 39.

The coolant member 35 further includes a series of parallel lands 47 (FIG. 9) which extend upwardly from the base 39 and occupy a substantial part of the chamber. The upper surfaces of the lands 47 are physically bonded to the substrate 27. The lands 47 do not extend to the ends of the chamber and these opposed end regions of the chamber define a coolant inlet manifold 49 and a coolant outlet manifold 51. The lands 47 extend side by side substantially across the width of the chamber. The gaps between adjacent lands 47 define coolant flow channels 53.

It is evident from the above that the coolant inlet 45, the coolant manifold 49, the flow channels 53, the coolant outlet manifold 49, and the coolant outlet 46 define the coolant flow path of each module 23.

The applicant has found that selecting:
(i) the widths of the lands 47 and the channels 53 so that the ratio of the widths is of the order of 1:1; and
(ii) the height and width of the channels 53 so that the ratio of the height and the width is of the order of 2:1;

makes it possible to achieve sufficient heat transfer from the photovoltaic cells 5 to the coolant to maintain the photovoltaic cells 5 at a temperature of no more than 60° C. where, otherwise, an uncooled module would be at temperatures well in excess of 1000° C. in view of high intensities of solar radiation incident on the photovoltaic cells 5.

As is indicated above, the construction of the coolant member 35 makes it possible to achieve the high levels of heat transfer that are required to maintain the photovoltaic cells 5 at temperatures of no more than 60° C. and to accommodate substantially different thermal expansion of the coolant member 35 and the substrate 27 that otherwise would cause structural failure of the modules 23. Specifically, there is heat transfer from the substrate 27 to the coolant via direct contact of coolant with the substrate 27 and via the side wall 41 and the lands 47. The construction of the lands 47 as the means for defining the flow channels 53 substantially increases the heat transfer contact surface area with coolant. Specifically, the lands 47 provide an opportunity for heat transfer to the coolant via the sides and base of the channels 53. In addition, the lands 47 define a series of spaced "fingers" and this arrangement makes it possible to accommodate relative lateral movement of the substrate 27 and the coolant member 35 as a consequence of different thermal expansion of the materials from which these components are constructed and the materials that bond together these components.

FIG. 4 illustrates the position of one module 23 on the lower wall of the receiver 7. With reference to the Figure, the coolant inlet 45 opens into one coolant channel 17 of the coolant circuit and the diagonally-opposed coolant outlet 46 opens into an adjacent coolant channel 17 of the coolant circuit.

In use, as indicated by the arrows in FIGS. 4 and 5, coolant flows from one supply channel 17 into the inlet manifold 49 via the coolant inlet 45 and then flows from the coolant manifold 49 into and along the length of the channels 53 to the outlet manifold 51. Thereafter, coolant flows from the chamber via the coolant outlet 46 into the adjacent channel 17.

Many modifications may be made to the preferred embodiment described above without departing from the spirit and scope of the present invention.

By way of example, whilst the preferred embodiment includes 1536 photovoltaic cells 5 mounted to 64 modules 23 with 24 cells per module, the present invention is not so limited and extends to any suitable number and size of photovoltaic cells and modules.

By way of further example, whilst the photovoltaic cells are mounted so that the exposed surface of the cell array is a flat surface, the present invention is not so limited and extends to any suitable shaped surface, such as curved or stepped surfaces.

By way of further example, whilst the preferred embodiment includes the receiver coolant circuit that forms part of the support frame of the receiver, the present invention is not so limited and extends to arrangements in which the coolant circuit is not part of the structural frame of the receiver.

By way of further example, whilst the preferred embodiment includes a series of parallel elongate lands 47 which extend between the ends of the coolant chamber, the present invention is not so limited and it is not essential that the lands be parallel and it is not essential that the lands be elongate. Specifically, it is within the scope of the present invention that there be gaps in the lands 47. The gaps in the lands may be required in certain circumstances to improve lateral flexibility of the coolant member 35 relative to the substrate 27.

By way of further example, whilst the preferred embodiment includes a dish reflector in the form of an array of parabolic array of mirrors 3, the present invention is not so limited and extends to any suitable means of concentrating solar radiation onto a receiver.

By way of further example, whilst the preferred embodiment of the receiver is constructed from extruded components, the present invention is not so limited and the receiver may be made by any suitable means.

The invention claimed is:

1. A system for generating electrical power from solar radiation which includes:
   (a) a receiver that includes (i) a plurality of modules, each module including a plurality of photovoltaic cells for converting solar energy into electrical energy, (ii) an electrical circuit for transferring the electrical energy output of the photovoltaic cells, and (iii) a frame that supports the modules in an array of modules so that the photovoltaic cells form an at least substantially continuous surface that is exposed to solar radiation; and
   (b) a means for concentrating solar radiation onto the receiver; and
   the system being characterised in that each module includes an electrical connection that forms part of the receiver electrical circuit, each module includes a support structure that supports the photovoltaic cells, the receiver includes a coolant circuit for cooling the photovoltaic cells with a coolant, the coolant circuit includes a coolant flow path in each module that is in thermal contact with the photovoltaic cells so that in use coolant flowing through the flow path extracts heat from the photovoltaic cells and thereby cools the cells, and the support structure in each module defines the coolant flow path for the module.

2. The system defined in claim 1 wherein the plurality of modules is arranged in a two-dimensional array of modules.

3. The system defined in claim 1 wherein the support structures are arranged such that there is parallel flow of coolant through the flow paths in the support structures.

4. The system defined in claim 1 wherein the support structure includes:
   (a) a coolant member that at least partially defines the flow path, the coolant member being formed from a thermally conductive material; and
   (b) a substrate interposed between the coolant member and the photovoltaic cells, the substrate including a thermally conductive layer formed from a thermally conductive material that is an electrical insulator.

5. The system defined in claim 4 wherein the coolant member acts as a heat sink.

6. The system defined in claim 4 wherein the coolant member of each support structure comprises a plurality of flow channels defining part of the flow path.

7. The system defined in claim 4 wherein the thermally conductive layer of the substrate is formed from a ceramic material.

8. The system defined in claim 4 wherein the substrate includes a metallised layer interposed between the photovoltaic cells and the thermally conductive layer.

9. The system defined in claim 4 wherein the substrate includes a metallised layer interposed between the thermally conductive layer and the coolant member.

10. The system defined in claim 4 wherein the coolant member includes a base, a wall that extends upwardly from the base and contacts the substrate whereby the base, the side wall and the substrate define an enclosed coolant chamber that forms part of the coolant flow path.

11. The system defined in claim 10 wherein the coolant member includes a series of spaced-apart lands that extend from the base and contact the substrate in a central part of the chamber and define therebetween channels for coolant flow from near one end of the chamber to near an opposite end of the chamber.

12. The system defined in claim 11 wherein the spaced apart lands are parallel so that the channels are parallel.

13. The system defined in claim 11 wherein the ratio of the total width of the channels and the total width of the lands is in the range of 0.5:1 to 1.5:1.

14. The system defined in claim 13 wherein the ratio of the total width of the channels and the total width of the lands is of the order of 1:1.

15. The system defined in claim 11 wherein the ratio of the height and the width of each channel is in the range of 1.5:1 to 5:1.

16. The system defined in claim 15 wherein the ratio of the height and the width of each channel is in the range of 1.5:1 to 2.5:1.

17. The system defined in claim 10 wherein the base includes a coolant inlet and a coolant outlet for supplying coolant to and removing coolant from opposite ends of the chamber, the opposite ends of the chamber forming coolant manifolds.

18. The system defined in claim 17 wherein the coolant inlet, coolant manifolds, coolant outlet, and coolant channels define the coolant flow path of the support structure of the module.

19. The system defined in claim 1 wherein the frame includes a coolant flow path that supplies coolant to the coolant inlets of the modules and removes coolant from the coolant outlets of the modules.

20. The system defined in claim 1 wherein the means for concentrating solar radiation onto the receiver is a dish reflector that includes an array of mirrors for reflecting solar radiation that is incident on the mirrors towards the photovoltaic cells.

21. The system defined in claim 20 wherein the surface area of the mirrors of the dish reflector that is exposed to solar radiation is substantially greater than the surface area of the photovoltaic cells that is exposed to reflected solar radiation.

22. A photovoltaic cell module for a receiver of a system for generating electrical power from solar radiation, which module includes: a plurality of photovoltaic cells, an electrical connection for transferring the electrical energy output of the photovoltaic cells, a coolant flow path that is in thermal contact with the photovoltaic cells so that in use coolant flowing through the flow path cools the photovoltaic cells, and a structure that supports the photovoltaic cells and defines the coolant flow path for extracting heat from the photovoltaic cells, the support structure including a coolant member formed from a thermally conductive material that at least partially defines the flow path, the support structure further including a substrate interposed between the coolant member and the photovoltaic cells, the substrate including a thermally conductive layer formed from a thermally conductive material that is an electrical insulator, and the coolant member including a base, a wall that extends upwardly from the base and contacts the substrate whereby the base, the side wall and the substrate define an enclosed coolant chamber that forms part of the coolant flow path.

23. The system defined in claim 22 wherein the coolant member acts as a heat sink.

24. The system defined in claim 22 wherein the coolant member comprises a plurality of flow channels.

25. The system defined in claim 22 wherein the thermally conductive layer of the substrate is formed from a ceramic material.

26. The system defined in claim 22 wherein the substrate includes a metallised layer interposed between the photovoltaic cells and the thermally conductive layer.

27. The system defined in claim 22 wherein the substrate includes a metallised layer interposed between the thermally conductive layer and the coolant member.

28. The system defined in claim 22 wherein the coolant member includes a series of spaced-apart lands that extend from the base and contact the substrate in a central part of the chamber and define therebetween channels for coolant flow from near one end of the chamber to near an opposite end of the chamber.

29. The system defined in claim 28 wherein the spaced apart lands are parallel so that the channels are parallel.

30. The system defined in claim 22 wherein the base includes a coolant inlet and a coolant outlet for supplying coolant to and removing coolant from opposite ends of the chamber, the opposite ends of the chamber forming coolant manifolds.

31. A system for generating electrical power from solar radiation which includes:
   (a) a receiver that includes a plurality of photovoltaic cells for converting solar energy into electrical energy and an electrical circuit for transferring the electrical energy output of the photovoltaic cells; and
   (b) a means for concentrating solar radiation onto the receiver; and the system being characterised in that the receiver includes a plurality of photovoltaic cell modules, each module includes a plurality of photovoltaic cells, each module includes an electrical connection that forms part of the receiver electrical circuit, each module includes a support structure that supports the photovoltaic cells, the receiver includes a coolant circuit for cooling the photovoltaic cells with a coolant, and the coolant circuit includes a coolant flow path in each module that is in thermal contact with the photovoltaic cells so that in use coolant flowing through the flow path extracts heat from the photovoltaic cells and thereby cools the cells, each support structure defines the coolant flow path in a corresponding module for extracting heat from the photovoltaic cells and includes a coolant member formed from a thermally conductive material that at least partially defines the flow path, and each support structure further includes a substrate interposed between the coolant member and the photovoltaic cells, the substrate including a layer formed from a thermally conductive material that is an electrical insulator, and each coolant member includes a base, a wall that extends upwardly from the base and contacts the substrate whereby the base, the side wall and the substrate define an enclosed coolant chamber that forms part of the coolant flow path.

32. The system defined in claim 31 wherein the coolant member includes a series of spaced-apart lands that extend from the base and contact the substrate in a central part of the chamber and define therebetween channels for coolant flow from near one end of the chamber to near an opposite end of the chamber.

33. The system defined in claim 32 wherein the spaced apart lands are parallel so that the channels are parallel.

34. The system defined in claim 32 wherein the ratio of the total width of the channels and the total width of the lands is in the range of 0.5:1 to 1.5:1.

35. The system defined in claim 34 wherein the ratio of the total width of the channels and the total width of the lands is of the order of 1:1.

36. The system defined in claim 32 wherein the ratio of the height and the width of each channel is in the range of 1.5:1 to 5:1.

37. The system defined in claim 36 wherein the ratio of the height and the width of each channel is in the range of 1.5:1 to 2.5:1.

38. The system defined in claim 31 wherein the base includes a coolant inlet and a coolant outlet for supplying coolant to and removing coolant from opposite ends of the chamber, the opposite ends of the chamber forming coolant manifolds.

39. The system defined in claim 38 wherein the coolant inlet, coolant manifolds, coolant outlet, and coolant channels define the coolant flow path of the support structure of the module.

* * * * *